US012635060B2

(12) United States Patent
Kaestel et al.

(10) Patent No.: US 12,635,060 B2
(45) Date of Patent: May 19, 2026

(54) PREDICTIVE MAINTENANCE OF LIGHT-EMITTING ELEMENTS

(71) Applicant: TRINAMIX GMBH, Ludwigshafen am Rhein (DE)

(72) Inventors: David Kaestel, Ludwigshafen am Rhein (DE); Felix Schmidt, Ludwigshafen am Rhein (DE); Felix Berno Mueller, Ludwigshafen am Rhein (DE)

(73) Assignee: TRINAMIX GMBH, Ludwigshafen am Rhein (DE)

( * ) Notice: Subject to any disclaimer, the term of this patent is extended or adjusted under 35 U.S.C. 154(b) by 54 days.

(21) Appl. No.: 18/699,441

(22) PCT Filed: Nov. 8, 2022

(86) PCT No.: PCT/EP2022/081134
§ 371 (c)(1),
(2) Date: Apr. 8, 2024

(87) PCT Pub. No.: WO2023/083811
PCT Pub. Date: May 19, 2023

(65) Prior Publication Data
US 2024/0407074 A1      Dec. 5, 2024

(30) Foreign Application Priority Data
Nov. 9, 2021      (EP) ..................................... 21207183

(51) Int. Cl.
*H05B 45/30*          (2020.01)
*G01R 31/44*          (2020.01)
(Continued)

(52) U.S. Cl.
CPC ............. *H05B 47/20* (2020.01); *G01R 31/44* (2013.01); *H05B 39/04* (2013.01)

(58) Field of Classification Search
CPC .......... H05B 6/68; H05B 6/682; H05B 45/14; H05B 45/30; H05B 45/48; H05B 45/50;
(Continued)

(56) References Cited

U.S. PATENT DOCUMENTS 6,320,331 B1    11/2001  Iida et al.
6,587,490 B2 *   7/2003  Crawford ................ H01S 5/042
                                                372/38.07
(Continued)

FOREIGN PATENT DOCUMENTS

EP          2051567 A1      4/2009
JP          3300173 B2      4/2002
WO      2018062989 A2      4/2018

OTHER PUBLICATIONS

International Search Report for PCT/EP2022/081134 dated Feb. 16, 2023, 4 pages.
(Continued)

*Primary Examiner* — Thai Pham
(74) *Attorney, Agent, or Firm* — Armstrong Teasdale LLP

(57)          ABSTRACT

Disclosed herein is a method of controlling operation of at least one light-emitting system including at least one light-emitting element. The method includes:
  a) monitoring at least temporarily, at least one electrical parameter of the light-emitting element;
  b) evaluating the electrical parameter and verifying if the electrical parameter meets at least one predetermined criterion; and
  c) taking at least one safeguard action depending on the outcome of step b).

17 Claims, 2 Drawing Sheets

(51) Int. Cl.
  _H05B 39/04_        (2006.01)
  _H05B 47/20_        (2020.01)
(58) Field of Classification Search
  CPC ...... H05B 47/00; H05B 47/10; H05B 47/105;
                                              H05B 47/20
  See application file for complete search history.

(56)                    References Cited

U.S. PATENT DOCUMENTS

2011/0187271  A1      8/2011  Bouws et al.
2012/0105228  A1*    5/2012  Loveland ............. H05B 47/105
                                                            340/540
2017/0347413  A1*   11/2017  John ...................... H05B 47/22
2021/0173014  A1*    6/2021  Stoeger ............... H05B 45/375

OTHER PUBLICATIONS

Written Opinion for PCT/EP2022/081134 dated Feb. 16, 2023, 6
pages.

* cited by examiner

PREDICTIVE MAINTENANCE OF LIGHT-EMITTING ELEMENTS

CROSS-REFERENCE TO RELATED APPLICATIONS

This application is a U.S. National Phase Application of International Patent Application No. PCT/EP22/81134, filed Nov. 8, 2022, which claims priority to European Patent Application No. 21207183.1 filed Nov. 9, 2021, and each of which is hereby incorporated by reference herein.

TECHNICAL FIELD

The invention relates to a method of controlling operation of at least one light-emitting system comprising at least one light-emitting element and a light-emitting system comprising at least one light-emitting element. Generally, such methods and systems may be employed for various applications. Specifically, the methods and systems may for example be employed in the field of spectroscopy. This may specifically include spectrometers working in the visible optical spectrum or in the infrared spectrum, more specifically in the near infrared spectrum or in the middle infrared spectrum. It may further include Fourier Transform Infrared (FTIR) devices or gas spectroscopy. Moreover, the methods and systems of the present invention may also be employed for interferometric applications such as white light interferometry. Thus, such methods and systems may specifically be used for lab measurements. Nevertheless, they may also be used in industrial environments including at-line measurements and in-line measurements. They may even be used in consumer environments, e.g. for air quality measurements. Further, they may be used in lighting applications such as in the automotive sector or in home appliances or for signaling. Typically, such applications are for example often relevant for safety issues or health issues. However, further kinds of applications are also possible.

BACKGROUND ART

Light-emitting elements are prone to degradation and thus have a limited lifetime. Specifically, aging processes due to mechanical and thermal load can influence the structure of the materials in the light-emitting elements. In consequence, the light-emitting elements may fail or break without prior notice. In state of the art standard drivers for light-emitting elements, e.g. for incandescent lamps, a DC power supply supplies a constant DC voltage to the light-emitting element. As a result, the output power is merely dependent on the resistance of the light-emitting element and thus on its temperature.

JP 3300173 B2 discloses an over-load detecting apparatus and an incandescence lamp control apparatus which can detect an overcurrent by cancelling variation of an input power supply voltage through detection of over-current through a DC circuit. A momentary value of a commercial power supply voltage is detected with a momentary value detecting circuit and a load current is converted into a voltage by a current transformer and is then guided to an over-current detector. The over-current detector detects an over-current depending on that an output voltage of the current transformer is equal to or higher than the threshold value or not when the momentary value has reached the predetermined voltage and outputs the result to a phase control circuit. In the phase control circuit, a gate control signal is outputted to a triac so that an incandescent lamp is controlled to light with a half-wave when the over-current is detected.

US 2012/105228 A1 describes a method and apparatus for providing a desired warning signal for a lighting unit. A coded warning system is provided employing a detection module and a signal generating module, wherein the detection module is configured to obtain information regarding the detection of one or more operating parameters of the lighting unit and the signal generating module generates a desired warning signal selected from a plurality of warning signals, upon determination that one or more of the operating parameters are abnormal operating parameters. Each warning signal of the plurality of warning signals is indicative of a specific abnormal operating parameter or a known combination of specific abnormal operating parameters.

EP 2 051 567 A1 describes a method for controlling the operation of a lighting unit comprising a plurality of lighting elements and a dimmable power supply unit with an output for adjusting the brightness of at least some of the lighting elements. The method provides that for at least one dimmer setting at least one real electrical parameter is measured, as a function of the absorption of the lighting elements and that the measured electrical parameter is compared with at least one previously-stored theoretical value.

US 2021/173014 A1 describes a method that carries out a self-test of an electrical converter circuit, by use of a control device, proceeding from a known operating point at which a predetermined electrical operating variable has a predetermined starting value, wherein a measurement cycle is begun by the converter circuit being operated. It is additionally provided that the time since the starting of the measurement cycle is detected, and the electrical operating variable and the time constitute two monitoring variables of the self-test. The measurement cycle is ended if one of the two monitoring variables satisfies an ending criterion. A test value is then formed from a measurement value of the other of the two monitoring variables at the end of the measurement cycle and a check is made to ascertain whether the test value lies outside a predetermined reference interval. If so an error signal is generated.

U.S. Pat. No. 6,320,331 B1 describes a light source apparatus used in a video endoscope system having a charge coupled device (CCD) image sensor and a monitor. The light source apparatus provides illumination to a scene to be imaged by the CCD image sensor and displayed on the monitor. The light source apparatus includes a discharge lamp serving as a light source. The lamp is subject to progressive degradation during use so that its output light intensity achievable with a given level of input current gradually decreases through its lifetime. The current supplied to the lamp is controlled using a feedback control technique so as to maintain the output light intensity of the lamp at a substantially fixed, desired intensity level.

US 2017/347413 A1 describes devices and methods for protecting against a surge in a luminaire. For example, a controller for use with a luminaire is provided. The controller can include a first circuit configured to sense a surge in voltage or current. The controller can further include a second circuit configured to switch a relay in response to the first circuit having sensed the surge in voltage or current.

US 2011/187271 A1 describes a system and method for detecting light fixture failure and for enhancing energy efficient operation of multiple light fixtures. The system includes multiple light control modules and a gateway. The light control modules alert the gateway of a bulb or ballast failure based on light fixture power consumption. The light control module can indicate a sudden failure, a slow failure, a striating failure, a stuck relay failure and a start-up failure. The light control modules can include a photo-sensor and an occupancy sensor for measuring brightness and occupancy, respectively, in the vicinity of one or more light fixtures. The gateway can distribute operating instructions to the light control modules based on changes in the ambient temperature and based on the power consumption of nearby light fixtures.

WO 2018/062989 A2 describes an illumination system for greenhouses comprising a plurality of lamp units comprising at least one LED load and a driver, a central monitoring device adapted for remotely monitoring at least one operational parameter of the lamp units and for generating an alerting signal for service personnel when it detects that the monitored parameter is outside a predetermined range, and with communication means for communicating information to the central monitoring device. If a group of lamp units is supplied by a common mains supply line, the system may include a current sensor arranged in or at the common supply line, for communicating to the central monitoring device a current sense signal indicating the actual current flowing in the common supply line.

Despite the advantages achieved by the known light-emitting elements, various technical challenges still remain. Specifically, it is still not possible to reliably foresee a failure of the light-emitting element and, thus, to take precautionary measures. In consequence, maintenance of the light-emitting element is more difficult and a lifetime of the light-emitting element may be shorter. Specifically, the light-emitting element may break without prior notice. This may negatively affect an operation and a use of the light-emitting element or even unintentionally interrupt the operation and use of the light-emitting element. Specifically with regard to safety or health applications, this may entail severe negative consequences.

Problem to be Solved

It is therefore desirable to provide a method of controlling operation of at least one light-emitting system as well as a corresponding light-emitting system which overcome the above-mentioned disadvantages of known methods and systems of similar kind. Specifically, the methods and systems shall be suited to ensure a reliable operation and a long lifetime of light-emitting elements.

SUMMARY

This problem is addressed by a method of controlling operation of at least one light-emitting system comprising at least one light-emitting element and a light-emitting system comprising at least one light-emitting element, with the features of the independent claims. Advantageous embodiments which might be realized in an isolated fashion or in any arbitrary combinations are listed in the dependent claims as well as throughout the specification.

In a first aspect of the present invention, a method of controlling operation of at least one light-emitting system comprising at least one light-emitting element is disclosed.

The term "controlling" as used herein is a broad term and is to be given its ordinary and customary meaning to a person of ordinary skill in the art and is not to be limited to a special or customized meaning. The term specifically may refer, without limitation, to an action of at least one of monitoring, regulating, adjusting, adapting, modifying and manipulating at least one entity. Specifically, the operation of the light-emitting system may be monitored permanently or at least temporarily and may be adapted, if necessary or desired. Thus, as an example, the operation may be regulated in order to keep at least one predetermined value stable or constant. Additionally or alternatively, as an example, the operation may be modified in order to set at least one new predetermined value. As an example, a power, more specifically a voltage and/or a current, applied to the light-emitting element of the light-emitting system may be monitored and adapted, if necessary or desired.

The term "light" as used herein is a broad term and is to be given its ordinary and customary meaning to a person of ordinary skill in the art and is not to be limited to a special or customized meaning. The term specifically may refer, without limitation, to a partition of electromagnetic radiation which is, usually, referred to as "optical spectral range" and which comprises one or more of the visible spectral range, the ultraviolet spectral range and the infrared spectral range. Herein, the term "ultraviolet spectral range", generally, refers to electromagnetic radiation having a wavelength of 1 nm to 380 nm, preferably of 100 nm to 380 nm. Further, in partial accordance with standard ISO-21348 in a valid version at the date of this document, the term "visible spectral range", generally, refers to a spectral range of 380 nm to 760 nm. The term "infrared spectral range" (IR) generally refers to electromagnetic radiation of 760 nm to 1000 µm, wherein the range of 760 nm to 1.5 µm is usually denominated as "near infrared spectral range" (NIR) while the range from 1.5 u to 15 µm is denoted as "mid infrared spectral range" (MidIR) and the range from 15 µm to 1000 µm as "far infrared spectral range" (FIR). Preferably, light used for the typical purposes of the present invention is light in the infrared (IR) spectral range, more preferred, in the near infrared (NIR) and the mid infrared spectral range (MidIR), especially the light having a wavelength of 1 µm to 5 µm, preferably of 1 µm to 3 µm.

The term "system" as used herein is a broad term and is to be given its ordinary and customary meaning to a person of ordinary skill in the art and is not to be limited to a special or customized meaning. The term specifically may refer, without limitation, to an arbitrary set of interacting or interdependent components or parts forming a whole. Specifically, the components may interact with each other in order to fulfill at least one common function. The at least two components may be handled independently or may be coupled or connectable.

The term "light-emitting system" as used herein is a broad term and is to be given its ordinary and customary meaning to a person of ordinary skill in the art and is not to be limited to a special or customized meaning. The term specifically may refer, without limitation, to a system which is at least, but not necessarily exclusively, configured for emitting light, specifically in a controlled fashion, e.g. by emitting a predetermined spectrum and/or a predetermined intensity. As an example, the light-emitting system may further be configured for measuring data, e.g. related to emitting light, and optionally for providing the data to at least one of an external device and a user. As an example, the light-emitting system may further be configured for receiving instructions, e.g. related to emitting light, from at least one of the external device and the user, e.g. by using at least one interface. As said, the light-emitting system comprises at least one light-emitting element. Thus, the light-emitting system may specifically be configured for emitting light by using the light-emitting element.

The term "light-emitting element" as used herein is a broad term and is to be given its ordinary and customary meaning to a person of ordinary skill in the art and is not to be limited to a special or customized meaning. The term specifically may refer, without limitation, to a device configured for emitting light, specifically in the infrared spectral range, i.e. infrared light. As an example, the light-emitting element may be configured for emitting light due to thermal heating and/or may be or may comprise at least one thermal radiator. Such thermal heating may specifically be induced by applying power to the light-emitting element, e.g. for heating up a resistor. Thus, the light-emitting element may comprise at least one electric connection and/or at least one filament. Additionally or alternatively, the light-emitting element may comprise at least one of a light-emitting diode and a laser diode. Further kinds of light-emitting elements may also be feasible.

The method comprises the following method steps:
- a) monitoring, at least temporarily, at least one electrical parameter of the light-emitting element;
- b) evaluating the electrical parameter and verifying if the electrical parameter meets at least one predetermined criterion; and
- c) taking at least one safeguard action depending on the outcome of step b).

The method steps a)-c) may be performed in the given order. It shall be noted, however, that a different order may also be possible. Further, one or more of the method steps may be performed once or repeatedly. Further, two or more of the method steps may be performed simultaneously or in a timely overlapping fashion. The method may comprise further method steps which are not listed.

The term "temporarily" as used herein is a broad term and is to be given its ordinary and customary meaning to a person of ordinary skill in the art and is not to be limited to a special or customized meaning. The term specifically may describe a duration of a process which is performed for a limited time, such as once, repeatedly or over at least one limited duration. The term specifically may refer, without limitation, to a process being performed at least one of: at at least one individual point in time; over at least one individual time interval. Thus, as an example, the electrical parameter may repeatedly be measured after a predetermined period of time has passed. Thus, the term "at least temporarily" may refer to a process which is performed temporarily or permanently. Consequently, the electrical parameter may be monitored temporarily or may be monitored permanently.

The term "electrical parameter" as used herein is a broad term and is to be given its ordinary and customary meaning to a person of ordinary skill in the art and is not to be limited to a special or customized meaning. The term specifically may refer, without limitation, to a performance indicator of an electrical device, specifically of the light-emitting element. In other words, the electrical parameter may specifically be characteristic for a performance of the light-emitting element. The performance indicator, specifically, may be or may comprise at least one measurable electrical variable or measurement value. Further details and examples will be given below.

The term "criterion" as used herein is a broad term and is to be given its ordinary and customary meaning to a person of ordinary skill in the art and is not to be limited to a special or customized meaning. The term specifically may refer, without limitation, to a predetermined condition and/or feature which is relevant for making at least one decision. The criterion may be met, in case a present feature is equal to or equivalent to the predetermined feature and/or if the present feature fulfills at least one predetermined condition or not. Only in case the criterion is met, a corresponding decision may be made, e.g. a corresponding action may be performed. Further details and examples will be given below.

The term "safeguard action" as used herein is a broad term and is to be given its ordinary and customary meaning to a person of ordinary skill in the art and is not to be limited to a special or customized meaning. The term specifically may refer, without limitation, to an action serving a protection of at least one entity, specifically the light-emitting element. Thus, by taking the safeguard action, a failure of the light-emitting element may specifically be counteracted. Thus, by taking the safeguard action, a lifetime of the light-emitting element may be extended and/or a reliability of the light-emitting element may be improved and/or a maintenance of the light-emitting system may be facilitated. Further details and examples will be given below.

The safeguard action specifically may comprise at least one of: modifying at least one electrical driving parameter of the light-emitting element; providing at least one item of warning information, specifically at least one item of warning information indicating a remaining lifetime of the light-emitting element; providing at least one item of information on the necessity of replacing the light-emitting element; modifying a power applied to the light-emitting element; reducing an on-time sequence of the light-emitting element; modifying a power distribution within the light-emitting element, e.g. by using at least one of a voltage divider, a potentiometer, an adjustable switching supply and an adjustable linear regulator. Reducing the on-time sequence of the light-emitting element may comprise reducing at least one of the number of measurements, the time rate of measurements and the time length of measurements conducted by using the light-emitting element. As an example, the light-emitting element, as an example, may only be used once per day instead of five times per day. The term "electrical driving parameter" as used herein is a broad term and is to be given its ordinary and customary meaning to a person of ordinary skill in the art and is not to be limited to a special or customized meaning. The term specifically may refer, without limitation, to an electrical parameter designated for driving or supplying at least one entity, specifically the light-emitting element. Thus, the electrical driving parameter may specifically refer to at least one of a power, a voltage and a current, specifically applied to the light-emitting element.

The electrical parameter specifically may comprise at least one of: a resistance of at least one conducting element of the light-emitting element, specifically of a filament of the light-emitting element; an electrical voltage, specifically a voltage drop over at least at least one conducting element of the light-emitting element, specifically of a filament of the light-emitting element; an electrical current, specifically an electrical current through at least at least one conducting element of the light-emitting element or through a driver of the light-emitting element, specifically through a filament of the light-emitting element; a power, specifically a power applied to at least one part of the light-emitting element, specifically to a filament of the light-emitting element.

Step b) may comprise forming a time derivative of the electrical parameter. Thus, step b) may comprise evaluating the time derivative of the electrical parameter. In other words, step b) may comprise evaluating a temporal change of the electrical parameter. Further, step b) may comprise verifying if the time derivative of the electrical parameter meets at least one predetermined criterion. In other words, step b) may comprise verifying if the temporal change of the electrical parameter meets at least one predetermined criterion. As an example, step b) may comprise verifying if a temporal change of the electrical parameter, e.g. of a resistance of a filament of the light-emitting element, is faster than a predetermined threshold.

Step b) may comprise filtering a temporal development of the electrical parameter by using at least one filter. The term "filter" including any grammatical variation thereof as used herein is a broad term and is to be given its ordinary and customary meaning to a person of ordinary skill in the art and is not to be limited to a special or customized meaning. The term specifically may refer, without limitation, to an entity configured for modifying or manipulating a signal or at least a portion of a signal, specifically depending on at least one of a frequency of the signal, an amplitude of the signal and a phase of the signal. More specifically, the filter may be configured for suppressing or at least weakening the signal or the portion of the signal, specifically noise or other unwanted portions of the signal. The filter may be analog. The filter may comprise at least one of a band-pass filter, a high-pass filter and a low-pass filter. The filter may be digital. The filter may specifically comprise at least one Savitzky-Golay filter. The filter may be configured for smoothing the signal or the portion of the signal. The filter may be configured for removing outliers from the signal or the portion of the signal.

Step b) may comprise predicting a remaining lifetime of the light-emitting element, e.g. from a characteristic timescale of an increase of the resistance of the filament of the light-emitting element. Generally, the resistance may increase continuously over the lifetime of the light-emitting element, specifically for incandescent lamps which are regulated at a constant power, as will be described below in further detail with respect to measured experimental data. Typically, the resistance may increase linearly at first and exponentially as an end of the lifetime of the light-emitting element comes closer. At the end of the lifetime, the resistance may typically decrease rapidly. At this point, the power applied to the light-emitting element would normally increase rapidly if it was not regulated, such that the light-emitting element would burn out due to a too large power applied to it. Thus, the skilled person can, as an example, predict the remaining lifetime of the light-emitting element from the monitored temporal increase of the resistance.

Step b) may comprise applying a trained model to at least one of: a temporal development of the electrical parameter and a first or higher order derivative of the electrical parameter. The term "trained model" as used herein is a broad term and is to be given its ordinary and customary meaning to a person of ordinary skill in the art and is not to be limited to a special or customized meaning. The term specifically may refer, without limitation, to a mathematical model for data interpretation, wherein the trained model was trained on at least one training dataset such as historical experimental data and/or simulated data. Before training, one or more parameters may still be variable, and the setting of the parameters may be up to a training process. In the trained model, the parameters of the model may have been set, in order to reflect an appropriate reaction of the model to one or more stimuli, wherein the setting of the parameters and/or the set values of the parameters may be the result of the training process. The trained model may provide for a model of an environment, and the model may be adapted for reacting to stimuli from the environment in an adequate fashion and for adjusting the model in accordance with observed deviations such that, in a subsequent run, the model reacts to stimuli in a more adequate fashion. The trained model may be configured for predicting at least one target variable for at least one input variable, such that, as an example, the at least one input variable forms a stimulus, and the target variable forms the response of the trained model. Specifically, the trained model may be configured for at least assisting evaluating the electrical parameter and verifying if the electrical parameter meets at least one predetermined criterion in step b).

Various trained models are known and may also be applied in the present case. The trained model, specifically, may comprise a regression model, more specifically a partial least square regression model. The regression model may comprise at least one fitting function. The fitting function may comprise at least one of: a linear fitting function; an exponential fitting function. Specifically, the fitting function may comprise a combination of a linear fitting function and an exponential fitting function. As an example, the electrical parameter may be a resistance of the filament of the light-emitting element and the fitting function may be as follows:

$$R(t) = R_0 + s \times t + A \exp\left(\frac{t}{\tau}\right),$$

wherein $R(t)$ describes a temporal development of the resistance R over time t, $R_0$ is an initial resistance, s is a slope of a linear fitting function, A is an amplitude of an exponential fitting function and $\tau$ is a time constant of the exponential fitting function.

The training of the trainable model, as an example, may comprise measuring the temporal developments $R(t)$ of the resistance R over time for a plurality of similar or equal light-emitting elements as training data and determining the fitting parameters $R_0$, s and $\tau$ out of these temporal developments, e.g. by weighting, averaging or the like the parameters of the training data. The fitting, as an example, may be performed by least squares regression. Other options of the training are feasible.

The safeguard action in step c) may comprise at least one of maintaining a constant power supplied to the light-emitting element and reducing a power supplied to the light-emitting element. Specifically, the safeguard action in step c) may comprise maintaining a constant power supplied to the light-emitting element at a rapid decrease of the resistance shortly before the end of the lifetime of the light-emitting element. Thus, a burnout of the light-emitting element due to a too large applied power may be prevented. Further, the safeguard action in step c) may comprise reducing a power supplied to the light-emitting element as a precautionary measure, e.g. at an exponential increase of the resistance. These measures may specifically extend the lifetime of the light-emitting element and/or facilitate a reliable operation of the light-emitting element.

The light-emitting element may comprise at least one incandescent lamp, e.g. a halogen incandescent lamp. The term "incandescent lamp" as used herein is a broad term and is to be given its ordinary and customary meaning to a person of ordinary skill in the art and is not to be limited to a special or customized meaning. The term specifically may refer, without limitation, to an electric light source having a heatable element, specifically a filament, which may be heated to a temperature such that it may emit light, specifically infrared light. Since the incandescent lamp can, therefore, be considered as a thermal emitter within the infrared spectral range, an emission power of the incandescent lamp decreases with increasing wavelength. The incandescent lamp may comprise at least one bulb having the filament positioned inside. The filament may comprise at least one wire, specifically a coiled wire. The filament may for example comprise tungsten. The bulb may for example be a glass bulb filled with an inert gas. The inert gas may for example comprise at least one of argon and nitrogen. Generally, when applying a power to the light-emitting element, a current flows through the filament and increases the temperature of the filament such that the filament emits thermal radiation, specifically infrared light. Further, the incandescent lamp may comprise at least one micromechanical system (MEMS) emitter, specifically a MEMS infrared emitter. Further kinds of incandescent lamps may also be feasible.

The predetermined criterion in step c) may comprise at least one of: a threshold criterion, specifically a threshold criterion for at least one of: the electrical parameter, at least one item of information derived from the electrical parameter, and a predicted lifetime of the light-emitting element; a change in a progression of the electrical parameter, specifically a change from a first fitting function to a second fitting function. The change from a first fitting function to a second fitting function may refer to the fact, that the second fitting function gives a better fit to the progression of the electrical parameter than the first fitting function. In other words, the second fitting function may deviate less from the progression of the electrical parameter than the first fitting function. Specifically, the predetermined criterion in step c) may comprise a change from a linear progression of the electrical parameter to an exponential progression of the electrical parameter. Thus, the predetermined criterion in step c) may comprise a change from a linear fitting function to an exponential fitting function, specifically in a sense that the exponential fitting function gives a better fit to the progression of the electrical parameter than the linear fitting function.

As indicated, step b) may comprise monitoring a resistance. The safeguard action in step c) may comprise at least one of: modifying at least one of a voltage and a current for reducing a power supplied to the light-emitting element. The safeguard action may be taken once the resistance exceeds a threshold. As an example, the safeguard action may be taken once the resistance exceeds a threshold $R_0+\Delta R$, wherein e.g. $\Delta R=R_0/20$. Additionally or alternatively, the safeguard action may be taken once a progression of the resistance changes from a linear progression to an exponential progression. Additionally or alternatively, the safeguard action may be taken once a temporal gradient of the resistance exceeds a threshold such as 2 Ohm/day for example. In other words, the safeguard action may be taken once a temporal change of the resistance is faster than the threshold, e.g. 2 Ohm/day.

The light-emitting system may further comprise at least one electrical driver circuit, specifically at least one electrical driver circuit comprising at least one driver path. The term "electrical driver circuit" as used herein is a broad term and is to be given its ordinary and customary meaning to a person of ordinary skill in the art and is not to be limited to a special or customized meaning. The term specifically may refer, without limitation, to an electrical circuit configured for driving at least one entity, specifically the light-emitting element. Thus, the electrical driver circuit may be configured for supplying the light-emitting element with power. Specifically, the electrical driver circuit may be configured for applying a voltage to the light-emitting element. The electrical driver circuit may comprise at least one driver configured for applying at least one electrical driving parameter to the light-emitting element such as a power and/or a voltage and/or a current. Optionally, the driver may further be configured for modifying the electrical driving parameter. The driver may comprise at least one power supply and at least one voltage control. Thus, the electrical driver circuit may specifically be configured for modifying at least the voltage applied to the light-emitting element. Step c) may comprise modifying a voltage by using the electrical driver circuit, specifically the voltage applied to the light-emitting element.

The electrical driver circuit may comprise at least one shunt configured for measuring the electrical parameter. The term "shunt" as used herein is a broad term and is to be given its ordinary and customary meaning to a person of ordinary skill in the art and is not to be limited to a special or customized meaning. The term specifically may refer, without limitation, to an electrical circuit or a portion of an electrical circuit configured for providing a low-resistance bypass for a current. Specifically, the shunt may be configured for at least one of current sensing and voltage sensing. The shunt may comprise at least one shunt resistor. Monitoring the electrical parameter in step b) may comprise measuring a current by using the shunt resistor, e.g. by further using a shunt voltage meter and/or a shunt current meter. Additionally or alternatively, monitoring the electrical parameter in step b) may comprise measuring the current by using at least one magnetic current sensor. In any case, from the measured current, further electrical parameters, specifically further electrical parameters of the light-emitting element, may be derived as the skilled person will understand. Specifically, as a voltage applied to the light-emitting element may be set, e.g. by using the voltage control of the electrical driver circuit, a resistance of the light-emitting element may be derived by using the measured current and Ohm's law.

The electrical driver circuit may comprise at least one feedback path. The term "feedback path" as used herein is a broad term and is to be given its ordinary and customary meaning to a person of ordinary skill in the art and is not to be limited to a special or customized meaning. The term specifically may refer, without limitation, to an electrical circuit or a portion of an electrical circuit configured for coupling a signal, specifically the electrical parameter or a quantity derived from the signal back to an origin of the signal, specifically to the driver. For example, as described, a current may be measured by using the shunt of the electrical driver circuit. From the measured current, a resistance of the filament of the light-emitting element may be derived. The resistance may be evaluated, specifically in regard to at least one predetermined criterion, and a result of the evaluation may be transmitted to the driver of the electrical driver circuit. Depending on the result, the driver may for example modify a voltage applied to the light-emitting element.

The feedback path may comprise at least one processing unit configured for at least one of data monitoring and data analysis. The data analysis may for example comprise at least one of data filtering and data fitting as described above. The evaluating of the electrical parameter in step b) may comprise generating at least one item of information by at least one of monitoring and analyzing the electrical parameter by using the feedback path. The safeguard action in step c) may depend on the item of information. Specifically, the item of information may at least comprise if the electrical parameter meets the predetermined criterion. The term "processing unit" as used herein is a broad term and is to be given its ordinary and customary meaning to a person of ordinary skill in the art and is not to be limited to a special or customized meaning. The term specifically may refer, without limitation, to an arbitrary device adapted to perform the named operations, preferably by using at least one data processing device and, more preferably, by using at least one processor and/or at least one application-specific integrated circuit. As an example, the processing unit may comprise at least one data processing device having a software code stored thereon comprising a number of computer commands. The processing unit may provide one or more hardware elements for performing one or more of the named operations and/or may provide one or more processors with software running thereon for performing one or more of the named operations. As an example, the processing unit may comprise one or more programmable devices such as one or more computers, application-specific integrated circuits (ASICs), Digital Signal Processors (DSPs), or Field Programmable Gate Arrays (FPGAs). Additionally or alternatively, however, the processing unit may also fully or partially be embodied by hardware. The processing unit may specifically be configured for performing at least one measurement cycle. An information as determined by the processing unit may be provided to at least one of a further apparatus and/or to a user, specifically in at least one of an electronic, visual, acoustic, or tactile fashion. The information as determined by the processing unit may be stored in a memory storage and/or in a separate storage device and/or may be passed on via at least one interface, such as a wireless interface and/or a wire-bound interface. The processing unit may further be configured for controlling at least a portion of the light-emitting system, specifically at least a portion of the electrical driver circuit.

The method may at least partially be computer-implemented. Specifically, at least the data analysis may at least partially be computer-implemented. Referring to the computer-implemented aspects of the invention, one or more of the method steps or even all of the method steps of the method according to one or more of the embodiments disclosed herein may be performed by using a computer or computer network. Thus, generally, any of the method steps including provision and/or manipulation of data may be performed by using a computer or computer network. Generally, these method steps may include any of the method steps, typically except for method steps requiring manual work, such as providing samples and/or certain aspects of performing actual measurements.

In a further aspect of the present invention, a light-emitting system comprising at least one light-emitting element is disclosed. The light-emitting system is configured for performing the method according to any one of the embodiments disclosed above or below in further detail, specifically automatically. The term "automatic" including any grammatical variation thereof as used herein is a broad term and is to be given its ordinary and customary meaning to a person of ordinary skill in the art and is not to be limited to a special or customized meaning. The term specifically may refer, without limitation, to a process which is performed at least partially without the necessity of human interaction, such as at least partially by a machine. Specifically, the process may be performed at least partially by means of at least one of a controller, a computer, a computer network and a machine, in particular without manual action and/or interaction with a user.

The light-emitting may specifically comprise at least one incandescent lamp. The light-emitting system may further comprise at least one electrical driver circuit configured for driving the light-emitting element. The electrical driver circuit may comprise at least one driver. The driver may comprise at least one power supply and at least one voltage control. The electrical driver circuit may comprise at least one shunt. The shunt may comprise at least one shunt resistor. The electrical driver circuit may comprise at least one feedback path. The feedback path may comprise at least one processing unit. For possible definitions and options regarding the light-emitting system, reference may be made to the embodiments of the method of controlling operation of at least one light-emitting system comprising at least one light-emitting element as described in further detail above.

The methods and devices according to the present invention may provide a large number of advantages over known methods and devices. In particular, they may extend the lifetime of light-emitting elements such as incandescent lamps, specifically by adapting a power applied to the light-emitting elements. Thus, they may facilitate a long lifetime and a reliable operation of the light-emitting elements. Specifically, they may prevent the light-emitting elements from breaking without prior notice. They may allow to predict a remaining lifetime of the light-emitting elements and inform a user about this remaining lifetime, such that the light-emitting elements can be replaced before breaking. Thus, they may specifically facilitate a maintenance of the light-emitting elements. After all, with the help of the methods and devices according to the present invention, an operation and use of the light-emitting elements may not be negatively affected or unintentionally interrupted due to an unexpected breaking of the light-emitting elements.

As used herein, the terms "have", "comprise" or "include" or any arbitrary grammatical variations thereof are used in a non-exclusive way. Thus, these terms may both refer to a situation in which, besides the feature introduced by these terms, no further features are present in the entity described in this context and to a situation in which one or more further features are present. As an example, the expressions "A has B", "A comprises B" and "A includes B" may both refer to a situation in which, besides B, no other element is present in A (i.e. a situation in which A solely and exclusively consists of B) and to a situation in which, besides B, one or more further elements are present in entity A, such as element C, elements C and D or even further elements.

Further, it shall be noted that the terms "at least one", "one or more" or similar expressions indicating that a feature or element may be present once or more than once typically are used only once when introducing the respective feature or element. In most cases, when referring to the respective feature or element, the expressions "at least one" or "one or more" are not repeated, notwithstanding the fact that the respective feature or element may be present once or more than once.

Further, as used herein, the terms "preferably", "more preferably", "particularly", "more particularly", "specifically", "more specifically" or similar terms are used in conjunction with optional features, without restricting alternative possibilities. Thus, features introduced by these terms are optional features and are not intended to restrict the scope of the claims in any way. The invention may, as the skilled person will recognize, be performed by using alternative features. Similarly, features introduced by "in an embodiment of the invention" or similar expressions are intended to be optional features, without any restriction regarding alternative embodiments of the invention, without any restrictions regarding the scope of the invention and without any restriction regarding the possibility of combining the features introduced in such way with other optional or non-optional features of the invention.

Summarizing and without excluding further possible embodiments, the following embodiments may be envisaged:

Embodiment 1: A method of controlling operation of at least one light-emitting system comprising at least one light-emitting element, the method comprising:

a) monitoring at least temporarily, at least one electrical parameter of the light-emitting element;

b) evaluating the electrical parameter and verifying if the electrical parameter meets at least one predetermined criterion; and c) taking at least one safeguard action depending on the outcome of step b).

Embodiment 2: The method according to the preceding embodiment, wherein the safeguard action comprises at least one of: modifying at least one electrical driving parameter of the light-emitting element; providing at least one item of warning information, specifically at least one item of warning information indicating a remaining lifetime of the light-emitting element; providing at least one item of information on the necessity of replacing the light-emitting element; modifying a power applied to the light-emitting element; reducing an on-time sequence of the light-emitting element; modifying a power distribution within the light-emitting element.

Embodiment 3: The method according to any one of the preceding embodiments, wherein the electrical parameter comprises at least one of: a resistance of at least one conducting element of the light-emitting element, specifically of a filament of the light-emitting element; an electrical voltage, specifically a voltage drop over at least at least one conducting element of the light-emitting element, specifically of a filament of the light-emitting element; an electrical current, specifically an electrical current through at least at least one conducting element of the light-emitting element or through a driver of the light-emitting element, specifically through a filament of the light-emitting element; a power, specifically a power applied to at least one part of the light-emitting element, specifically to a filament of the light-emitting element.

Embodiment 4: The method according to any one of the preceding embodiments, wherein step b) comprises forming a time derivative of the electrical parameter.

Embodiment 5: The method according to any one of the preceding embodiments, wherein step b) comprises filtering a temporal development of the electrical parameter by using at least one filter.

Embodiment 6: The method according to any one of the preceding embodiments, wherein step b) comprises predicting a remaining lifetime of the light-emitting element.

Embodiment 7: The method according to any one of the preceding embodiments, wherein step b) comprises applying a trained model to at least one of: a temporal development of the electrical parameter and a first or higher order derivative of the electrical parameter.

Embodiment 8: The method according to the preceding embodiment, wherein the trained model comprises a regression model.

Embodiment 9: The method according to the preceding embodiment, wherein the regression model comprises at least one fitting function.

Embodiment 10: The method according to the preceding embodiment, wherein the fitting function comprises at least one of: a linear fitting function; an exponential fitting function.

Embodiment 11: The method according to any one of the preceding embodiments, wherein the safeguard action in step c) comprises at least one of maintaining a constant power supplied to the light-emitting element and reducing a power supplied to the light-emitting element.

Embodiment 12: The method according to any one of the preceding embodiments, wherein the light-emitting element comprises at least one incandescent lamp.

Embodiment 13: The method according to any one of the preceding embodiments, wherein the predetermined criterion in step c) comprises at least one of: a threshold criterion, specifically a threshold criterion for at least one of: the electrical parameter, at least one item of information derived from the electrical parameter, and a predicted lifetime of the light-emitting element; a change in a progression of the electrical parameter, specifically a change from a first fitting function to a second fitting function.

Embodiment 14: The method according to any one of the preceding embodiments, wherein step b) comprises monitoring a resistance, wherein the safeguard action in step c) comprises at least one of: modifying at least one of a voltage and a current for reducing a power supplied to the light-emitting element.

Embodiment 15: The method according to the preceding embodiment, wherein the safeguard action is taken once the resistance exceeds a threshold and/or once a progression of the resistance changes from a linear progression to an exponential progression and/or once a temporal gradient of the resistance exceeds a threshold.

Embodiment 16: The method according to any one of the preceding embodiments, wherein the light-emitting system further comprises at least one electrical driver circuit, specifically at least one electrical driver circuit comprising at least one driver path.

Embodiment 17: The method according to the preceding embodiment, wherein the electrical driver circuit comprises at least one driver configured for applying at least one electrical driving parameter to the light-emitting element, and optionally further configured for modifying the electrical driving parameter.

Embodiment 18: The method according to the preceding embodiment, wherein the driver comprises at least one power supply and at least one voltage control, wherein step c) comprises modifying a voltage by using the electrical driver circuit.

Embodiment 19: The method according to any one of the three preceding embodiments, wherein the electrical driver circuit comprises at least one shunt configured for measuring the electrical parameter.

Embodiment 20: The method according to the preceding embodiment, wherein the shunt comprises at least one shunt resistor, wherein monitoring the electrical parameter in step b) comprises measuring a current by using the shunt resistor.

Embodiment 21: The method according to any one of the five preceding embodiments, wherein the electrical driver circuit comprises at least one feedback path.

Embodiment 22: The method according to the preceding embodiment, wherein the feedback path comprises at least one processing unit configured for at least one of data monitoring and data analysis, wherein the evaluating of the electrical parameter in step b) comprises generating at least one item of information by at least one of monitoring and analyzing the electrical parameter by using the feedback path.

Embodiment 23: The method according to the preceding embodiment, wherein the safeguard action in step c) depends on the item of information.

Embodiment 24: The method according to any one of the preceding embodiments, wherein the method is at least partially computer-implemented.

Embodiment 25: A light-emitting system comprising at least one light-emitting element, the light-emitting system being configured for performing the method according to any one of the preceding embodiments, specifically automatically.

Embodiment 26: The light-emitting system according to the preceding embodiment, wherein the light-emitting element comprises at least one incandescent lamp.

Embodiment 27: The light-emitting system according to any one of the preceding embodiments referring to a light-emitting system, wherein the light-emitting system further comprises at least one electrical driver circuit configured for driving the light-emitting element.

Embodiment 28: The light-emitting system according to the preceding embodiment, wherein the electrical driver circuit comprises at least one driver, wherein the driver comprises at least one power supply and at least one voltage control.

Embodiment 29: The light-emitting system according to any one of the two preceding embodiments, wherein the electrical driver circuit comprises at least one shunt, wherein the shunt comprises at least one shunt resistor.

Embodiment 30: The light-emitting system according to any one of the three preceding claims, wherein the electrical driver circuit comprises at least one feedback path, wherein the feedback path comprises at least one processing unit.

SHORT DESCRIPTION OF THE FIGURES

Further optional features and embodiments will be disclosed in more detail in the subsequent description of embodiments, preferably in conjunction with the dependent claims. Therein, the respective optional features may be realized in an isolated fashion as well as in any arbitrary feasible combination, as the skilled person will realize. The scope of the invention is not restricted by the preferred embodiments. The embodiments are schematically depicted in the Figures. Therein, identical reference numbers in these Figures refer to identical or functionally comparable elements.

DETAILED DESCRIPTION OF THE EMBODIMENTS

Figures 1, 2:
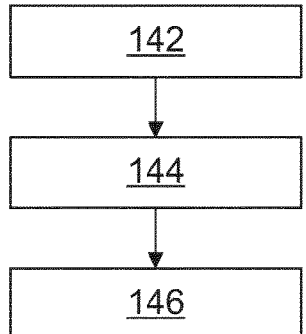
FIG. 1 shows an exemplary embodiment of a schematic circuit diagram of a light-emitting system comprising at least one light-emitting element.
FIG. 2 shows a flow chart of an exemplary embodiment of a method of controlling operation of at least one light-emitting system comprising at least one light-emitting element.

FIG. 1 shows an exemplary embodiment of a schematic circuit diagram of a light-emitting system 110 comprising at least one light-emitting element 112. The light-emitting system 110 is configured for performing the method according to any one of the embodiments disclosed above or below in further detail referring to a method of controlling operation of at least one light-emitting system 110 comprising at least one light-emitting element 112, specifically automatically. The light-emitting element 112 may specifically be grounded, i.e. connected to a ground 114. The light-emitting element 112 may specifically comprise at least one incandescent lamp 116.

As FIG. 1 shows, the light-emitting system 110 may further comprise at least one electrical driver circuit 118 configured for driving the light-emitting element 112. The electrical driver circuit 118 may comprise at least one driver path 120 and at least one feedback path 122. Thus, the electrical driver circuit 118, specifically the driver path 120, may comprise at least one driver 124. The driver 124 may be configured for applying at least one electrical driving parameter, such as at least one of a power, a current and a voltage, to the light-emitting element 112. The driver 124 may further optionally be configured for modifying the electrical driving parameter. The driver 124 may comprise at least one power supply 126 and at least one voltage control 128. The voltage control 128 may specifically be configured for modifying at least one voltage. The electrical driver circuit 118, specifically the driver path 120, may further comprise at least one shunt 130. The shunt 130 may be configured for measuring at least one electrical parameter, e.g. a voltage and/or a current. Thus, the shunt 130 may comprise at least one shunt resistor 132 and at least one shunt voltage meter 134 placed in parallel to the shunt resistor 132. Further, the electrical driver circuit 118, specifically the feedback path 122, may comprise at least one processing unit 136. The processing unit 136 may be configured for at least one of data monitoring and data analysis. Further, the light-emitting system 110 may comprise wires 138 and/or traces 140 for at least partially interconnecting the above-mentioned elements and devices comprised by the light-emitting system 110.

As FIG. 1 indicates, the power supply 126 may generate a power for supplying at least the light-emitting element 112 and optionally further elements and devices comprised by the light-emitting system 110. The voltage control 128 may then set a predetermined voltage which is to be applied to the light-emitting element 112. In consequence, a current may be generated which may depend on a resistance of the light-emitting element 112. Following the driver path 120, the generated current may pass the shunt 130, before reaching the light-emitting element 112. In the shunt 130, the current may mainly pass the low-resistance shunt resistor 132, before reaching the light-emitting element 112. A voltage drop over the shunt resistor 132 having a known resistance may be measured by using the shunt voltage meter 134. From the voltage drop, the current reaching the light-emitting element 112 may be determined by using Ohm's law and the known resistance of the shunt resistor 132. Thus, by multiplying the determined current and the set voltage the power reaching the light-emitting element 112 may be determined, specifically by using the processing unit 136. Thus, following the feedback path 122, at least one signal generated by the shunt 130, specifically by the shunt voltage meter 134, may be sent to the processing unit 136. In the processing unit 136, the signal may be further evaluated as will be described below in more detail. Further following the feedback path 122, the processing unit 136 may send at least one further signal to the driver 124, specifically to the voltage control 126, specifically for modifying the set voltage. In this way, a power applied to the light-emitting element 112 may be monitored and adapted, if necessary or desired. However, further options may also be feasible.

FIG. 2 shows a flow chart of an exemplary embodiment of a method of controlling operation of the light-emitting system 110 comprising the light-emitting element 112. The method comprises the following steps:

a) (denoted with reference number 142) monitoring, at least temporarily, at least one electrical parameter of the light-emitting element 112;

b) (denoted with reference number 144) evaluating the electrical parameter and verifying if the electrical parameter meets at least one predetermined criterion; and c) (denoted with reference number 146) taking at least one safeguard action depending on the outcome of step b).

The method steps a)-c) may be performed in the given order. It shall be noted, however, that a different order may also be possible. Further, one or more of the method steps may be performed once or repeatedly. Further, two or more of the method steps may be performed simultaneously or in a timely overlapping fashion. The method may comprise further method steps which are not listed.

The safeguard action may comprise at least one of: modifying at least one electrical driving parameter of the light-emitting element 112; providing at least one item of warning information, specifically at least one item of warning information indicating a remaining lifetime of the light-emitting element 112; providing at least one item of information on the necessity of replacing the light-emitting element 112; modifying a power applied to the light-emitting element 112; reducing an on-time sequence of the light-emitting element 112; modifying a power distribution within the light-emitting element 112.

The electrical parameter may comprise at least one of: a resistance of at least one conducting element of the light-emitting element 112, specifically of a filament of the light-emitting element 112; an electrical voltage, specifically a voltage drop over at least at least one conducting element of the light-emitting element 112, specifically of a filament of the light-emitting element 112; an electrical current, specifically an electrical current through at least at least one conducting element of the light-emitting element 112 or through a driver of the light-emitting element 112, specifically through a filament of the light-emitting element 112; a power, specifically a power applied to at least one part of the light-emitting element 112, specifically to a filament of the light-emitting element 112.

Step b) may comprise forming a time derivative of the electrical parameter. Step b) may comprise filtering a temporal development of the electrical parameter by using at least one filter. Step b) may comprise predicting a remaining lifetime of the light-emitting element 112. Step b) may comprise applying a trained model to at least one of: a temporal development of the electrical parameter and a first or higher order derivative of the electrical parameter. The trained model may comprise a regression model. The regression model may comprise at least one fitting function. The fitting function may comprise at least one of: a linear fitting function; an exponential fitting function.

The safeguard action in step c) may comprise at least one of maintaining a constant power supplied to the light-emitting element 112 and reducing a power supplied to the light-emitting element 112. The predetermined criterion in step c) may comprise at least one of: a threshold criterion, specifically a threshold criterion for at least one of: the electrical parameter, at least one item of information derived from the electrical parameter, and a predicted lifetime of the light-emitting element 112; a change in a progression of the electrical parameter, specifically a change from a first fitting function to a second fitting function. Step b) may comprise monitoring a resistance, wherein the safeguard action in step c) may comprise at least one of: modifying at least one of a voltage and a current for reducing a power supplied to the light-emitting element 112. The safeguard action may be taken once the resistance exceeds a threshold and/or once a progression of the resistance changes from a linear progression to an exponential progression and/or once a temporal gradient of the resistance exceeds a threshold.

Step c) may further comprise modifying a voltage by using the electrical driver circuit 118, specifically the voltage control 128. Monitoring the electrical parameter in step b) may comprise measuring a current by using the shunt resistor 132. Step b) may comprise generating at least one item of information by at least one of monitoring and analyzing the electrical parameter by using the feedback path 122, specifically the processing unit 136. The safeguard action in step c) may depend on the item of information. The method may at least partially be computer-implemented. Referring to the computer-implemented aspects of the invention, one or more of the method steps or even all of the method steps of the methods according to one or more of the embodiments disclosed herein may be performed by using a computer or computer network. Thus, generally, any of the method steps including provision and/or manipulation of data may be performed by using a computer or computer network. Generally, these method steps may include any of the method steps, typically except for method steps requiring manual work, such as providing samples and/or certain aspects of performing actual measurements.

FIGS. 3A-5B show experimental results of measurements on an exemplary embodiment of the light-emitting system 110 comprising the light-emitting element 112, specifically the incandescent lamp 116. In the measurements, a degradation process of the incandescent lamp 116 was analyzed over up to approximately 20 days. The power applied to the incandescent lamp 116 was set to 12 W, which was above a rated power of 10 W. Thus, increased aging of the incandescent lamp 116 was actively induced while monitoring a temporal development of the resistance of the incandescent lamp 116. As outlined above, the resistance of the incandescent lamp 116 can for example be determined by using the shunt 130. In the measurements, the resistance was measured once per minute.

Figure 3A:
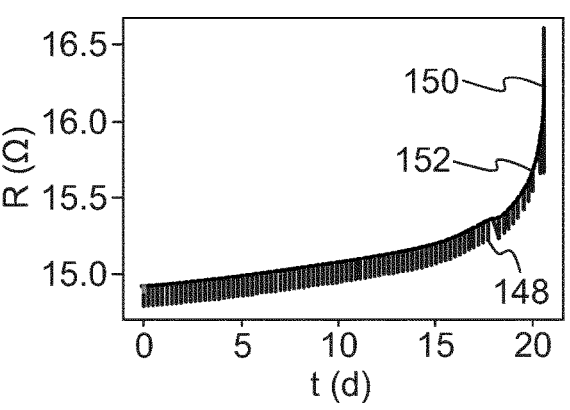
FIGS. 3A-5B show experimental results of measurements on an exemplary embodiment of a light-emitting system comprising at least one light-emitting element.
Figure 3B:
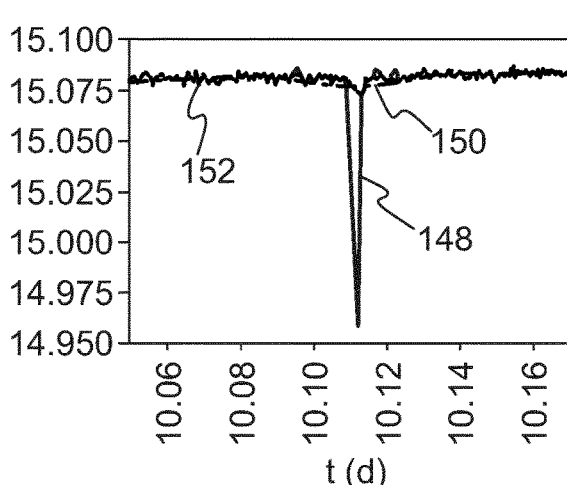

In FIGS. 3A and 3B, raw data of the measured resistance are denoted with reference number 148. Further, low-pass filtered data of the measured resistance are denoted with reference number 150. The low-pass filtered data 150 is based on the raw data 148 which was low-passed with a Savitzky-Golay filter with window length 161 and polynomial order 7 for optimized data analysis. Further, outlier filtered data of the measured resistance is denoted with reference number 152. The outlier filtered data 152 is based on the deviation of the raw data 148 from the low-pass filtered data 150. As FIGS. 3A and 3B show, outliers due to start and stop processes of the incandescent lamp 116 are effectively filtered out in the outlier filtered data 152. FIG. 3A shows a continuous increase of the resistance from initially approximately 15 (to eventually approximately 16.5 (before the incandescent lamp 116 burned out. Steps in the raw data 148 indicate stop and restart processes of the incandescent lamp 116. FIG. 3B shows a zoom into FIG. 3A at approximately day 10 of the measurement at a stop and restart process of the incandescent lamp 116.

Figure 4A:
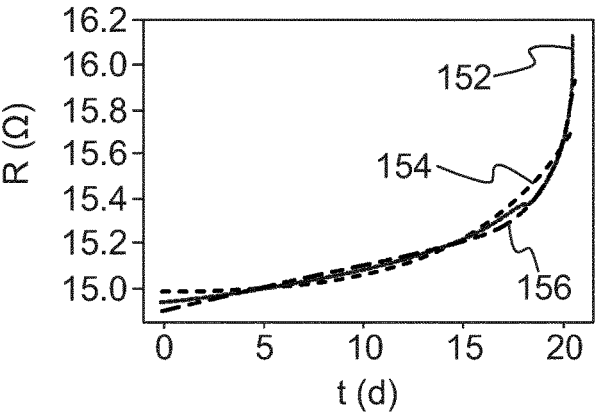
Figure 4B:
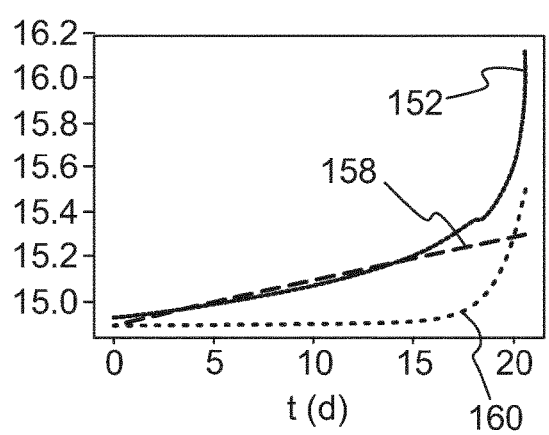

FIGS. 4A and 4B show exemplary models for the degradation of the incandescent lamp 116. Firstly, for comparison, the outlier filtered data 152 are shown again. In FIG. 4A, an exponential model, given by $$R(t) = R_0 + A \exp\left(\frac{t}{\tau}\right),$$

which was fitted to the outlier filtered data 152, is denoted with reference number 154. R(t) refers to a temporal development of the resistance R of the incandescent lamp 116 over time t, $R_0$ to an initial resistance, A to an amplitude and τ to a time constant of the exponential model 154. The exponential model 154 shows a strong deviation from the outlier filtered data 152 and thus from the measured temporal development of the resistance of the incandescent lamp 116.

Further, an extended model given by $$R(t) = R_0 + s \times t + A \exp\left(\frac{t}{\tau}\right),$$

which was fitted to the outlier filtered data 152, is denoted with reference number 156. The extended model 156 depicted in FIG. 4A, also referred to as linear-exponential model, comprises a superposition of a linear fitting function and an exponential fitting function. The introduced parameter s refers to a slope of the linear part of the extended model 156. The exponential part of the extended model 156 corresponds to exponential model 154 from above. A least square fit to the outlier filtered data 152 yields τ=1.2 days and $$s = 0.019 \frac{\Omega}{d}$$

for the extended model 156. Generally, time constants can vary depending on the specific kind of the incandescent lamp 116 and applied power. As FIG. 4A shows, the extended model 156 shows less deviation from the outlier filtered data 152 and thus from the measured temporal development of the resistance of the incandescent lamp 116 compared to the exponential model 154. In other words, the extended model 156 gives a better fit to the outlier filtered data 152 and thus to the measured temporal development of the resistance of the incandescent lamp 116 compared to the exponential model 154.

In FIG. 4B, contributions of the linear part and the exponential part of the extended model 156 are compared. A linear contribution is denoted with reference number 158. An exponential contribution is denoted with reference number 160. As indicated above, in the measurements, the degradation of the incandescent lamp 116 is indicated by an increase of the resistance of the incandescent lamp 116 given by the slope s. Thus, in accordance with FIG. 4B, it can be said that the incandescent lamp 116 degrades linearly at first and exponentially towards the end of its lifetime. In other words, in the measurements, an upcoming burnout of the incandescent lamp 116 is heralded by a change from a linear degradation to an exponential degradation of the incandescent lamp 116.

Figure 5A:
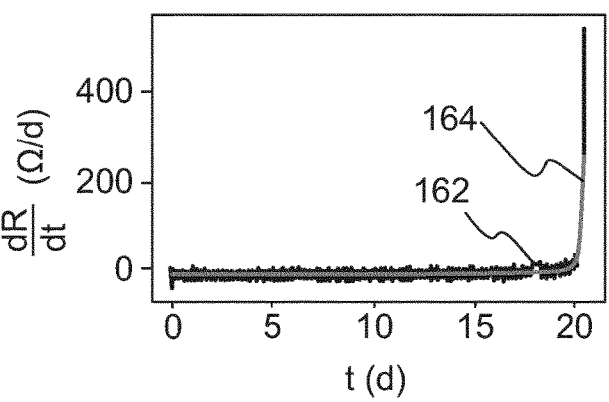
Figure 5B:
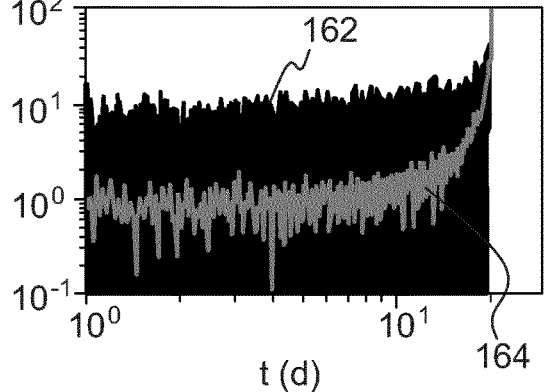

In FIGS. 5A and 5B, a time derivative $$\frac{dR}{dt}$$

of the measured resistance of the incandescent lamp 116 is denoted with reference number 162. The time derivative 162 was determined by using the outlier filtered data 152 of the measured resistance of the incandescent lamp 116 and the following formula:

$$\frac{dR}{dt}(t_i) = (R(t_{i+1}) - R(t_i))/(t_{i+1} - t_i),$$

wherein $t_i$ and $t_{i+1}$ refer to respective consecutive points in time during the measurement. Further, a low-pass filtered time derivative of the measured resistance of the incandescent lamp 116 is denoted with reference number 164. The low-pass filtered time derivative 164 was determined by using the time derivative 162 and a Savitzky-Golay filter with window length 201 and polynomial order 1. FIGS. 5A and 5B both show the time derivative 162 and the low-pass filtered time derivative 164 in linear and logarithmic scale, respectively. It can be seen that the time derivative 162 and specifically the low-pass filtered time derivative 164 is initially highly constant. Further, it can be seen, that an exponential increase of the resistance yields an exponential increase of the time derivative 162 and the low-pass filtered time derivative 164 as well. Thus, the burnout of the incandescent lamp 116 can be heralded by an exponential increase of the time derivative 162 and/or the low-pass filtered time derivative 164 as well.

LIST OF REFERENCE NUMBERS

110 light-emitting system
112 light-emitting element
114 ground
116 incandescent lamp
118 electrical driver circuit
120 driver path
122 feedback path
124 driver
126 power supply
128 voltage control
130 shunt
132 shunt resistor
134 shunt voltage meter
136 processing unit
138 wire
140 trace
142 method step a)
144 method step b)
146 method step c)
148 raw data of measured resistance
150 low-pass filtered data of measured resistance
152 outlier filtered data of measured resistance
154 exponential model
156 extended model
158 linear contribution
160 exponential contribution
162 time derivative of measured resistance
164 low-pass filtered time derivative of measured resistance

The invention claimed is:

1. A method of controlling operation of at least one light-emitting system comprising at least one light-emitting element, the method comprising:

monitoring, at least temporarily, at least one electrical parameter of the light-emitting element;

evaluating the electrical parameter and verifying if the electrical parameter meets at least one predetermined criterion by forming a time derivative of measurements of the electrical parameter and evaluating whether the time derivative of the electrical parameter exceeds a threshold value; and taking at least one safeguard action depending on the outcome of said evaluating, wherein the safeguard action comprises one of maintaining a constant power supplied to the light-emitting element or reducing a power supplied to the light-emitting element.

2. The method according to claim 1, wherein the safeguard action comprises at least one of modifying at least one electrical driving parameter of the light-emitting element; providing at least one item of warning information; providing at least one item of information on the necessity of replacing the light-emitting element; modifying a power applied to the light-emitting element; reducing an on-time sequence of the light-emitting element; or modifying a power distribution within the light-emitting element.

3. The method according to claim 1, wherein the electrical parameter comprises at least one of a resistance of at least one conducting element of the light-emitting element; an electrical voltage; an electrical current; or a power.

4. The method according to claim 1, wherein said evaluating further comprises filtering the time derivative of the measurements of the electrical parameter by using at least one filter.

5. The method according to claim 1, wherein said evaluating further comprises predicting a remaining lifetime of the light-emitting element.

6. The method according to claim 1, wherein said evaluating further comprises applying a trained model to the time derivative of the measurements of the electrical parameter.

7. The method according to claim 1, wherein the at least one predetermined criterion further comprises a change in a progression of the measurements of the electrical parameter.

8. The method according to claim 1, wherein said monitoring comprises monitoring a resistance, wherein the safeguard action comprises at reducing a power supplied to the light-emitting element by modifying a voltage or a current supplied to the light-emitting element.

9. The method according to claim 1, wherein the light-emitting system further comprises at least one electrical driver circuit, wherein the electrical driver circuit comprises at least one driver configured for applying at least one electrical driving parameter to the light-emitting element, wherein the driver comprises at least one power supply and at least one voltage control, wherein said taking a safeguard action comprises modifying a voltage by using the electrical driver circuit, wherein the electrical driver circuit comprises at least one shunt configured for measuring the electrical parameter, wherein the shunt comprises at least one shunt resistor, wherein said monitoring at least one electrical parameter comprises measuring a current by using the shunt resistor.

10. The method according to claim 9, wherein the electrical driver circuit comprises at least one feedback path.

11. The method according to claim 10, wherein the feedback path comprises at least one processing unit configured for at least one of data monitoring and data analysis, wherein the evaluating of the electrical parameter comprises generating at least one item of information by at least one of monitoring and analyzing the electrical parameter by using the feedback path, wherein the safeguard action depends on the item of information.

12. The method according to claim 1, wherein said monitoring comprises measuring and monitoring a resistance of the light-emitting element.

13. The method according to claim 12, wherein said evaluating comprises applying a low-pass filter to the measured resistance.

14. The method according to claim 12, wherein said forming a time derivative comprises determining a low-pass filtered time derivative of the measured resistance.

15. The method according to claim 12, further comprising predicting burnout of the light-emitting element when the time derivative of the measured resistance exceeds the threshold value.

16. A light-emitting system comprising at least one light-emitting element, the light-emitting system being configured for performing a method comprising:

monitoring, at least temporarily, at least one electrical parameter of the light-emitting element;

evaluating the electrical parameter and verifying if the electrical parameter meets at least one predetermined criterion by forming a time derivative of measurements of the electrical parameter and evaluating whether the time derivative of the electrical parameter exceeds a threshold value; and taking at least one safeguard action depending on the outcome of said evaluating and verifying, wherein the safeguard action comprises one of maintaining a constant power supplied to the light-emitting element or reducing a power supplied to the light-emitting element.

17. The light-emitting system according to claim 16, wherein the light-emitting system further comprises at least one electrical driver circuit configured for driving the light-emitting element, wherein the electrical driver circuit comprises at least one shunt, wherein the shunt comprises at least one shunt resistor, wherein the electrical driver circuit comprises at least one feedback path, wherein the feedback path comprises at least one processing unit.

* * * * *